United States Patent
Baschirotto et al.

(10) Patent No.: US 6,411,166 B2
(45) Date of Patent: Jun. 25, 2002

(54) FULLY DIFFERENTIAL, SWITCHED CAPACITOR, OPERATIONAL AMPLIFIER CIRCUIT WITH COMMON-MODE CONTROLLED OUTPUT

(75) Inventors: Andrea Baschirotto, Tortona; Paolo Cusinato, Sestri Levante; Giampiero Montagna, Tortona; Rinaldo Castello, Arcore, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/864,916

(22) Filed: May 23, 2001

(30) Foreign Application Priority Data

May 26, 2000 (IT) ........................................ TO2000A493

(51) Int. Cl.[7] .............................................. H03F 3/45
(52) U.S. Cl. .............................. 330/258; 330/9; 330/69
(58) Field of Search ................................ 330/9, 69, 258

(56) References Cited

U.S. PATENT DOCUMENTS 4,996,498 A * 2/1991 Hanna ........................ 330/258
5,049,831 A * 9/1991 Westwick .................... 330/107
5,359,294 A * 10/1994 Ganger et al. ............... 330/258
5,973,537 A   10/1999 Baschirotto et al. ........ 327/337

* cited by examiner

Primary Examiner—Robert Pascal
Assistant Examiner—Henry Choe
(74) Attorney, Agent, or Firm—Lisa K. Jorgenson; E. Russell Tarleton; SEED IP Law Group PLLC

(57) ABSTRACT

A switched operational amplifier with fully differential topology, alternately switchable on and off, and a control circuit. The operational amplifier has a first differential output (4a) and a second differential output, and a control terminal. The control circuit includes a capacitive detecting network including a first capacitor and a second capacitor connected between the first and second differential outputs and a common-mode node, and a third capacitor connected between the common-mode node and ground in a first operative condition, and between the common-mode node and the supply voltage in a second operative condition. A control transistor is connected between the common-mode node and the control terminal of the operational amplifier and supplies a control current correlated to the voltage on the common-mode node. A switchable voltage source, connected to the common-mode node, supplies a desired voltage in a first operative condition, when the operational amplifier is off.

18 Claims, 3 Drawing Sheets

US 6,411,166 B2

FULLY DIFFERENTIAL, SWITCHED CAPACITOR, OPERATIONAL AMPLIFIER CIRCUIT WITH COMMON-MODE CONTROLLED OUTPUT

TECHNICAL FIELD

The present invention refers to a fully differential, switched capacitor, operational amplifier circuit with common-mode controlled output.

BACKGROUND OF THE INVENTION

As is known, in the manufacture of numerous switched-capacitor circuits advantageously switched operational amplifiers with fully differential topology are used, i.e., having two output terminals supplying differential voltages that are symmetrical with respect to a common-mode voltage. Switched operational amplifiers, in fact, overcome certain drawbacks typical of traditional switched-capacitor circuits, especially if they operate at a low supply voltage (for example, just over 1 V) and with a low consumption. These drawbacks, in particular, are due to the difficulty, in the presence of low supply voltages, of efficiently driving switches connected to terminals having wide dynamics that are comparable to the rail-to-rail supply voltage, such as in case of the output of an operational amplifier. The fully differential topology, moreover, allows the manufacture of integrated circuits having small overall dimensions, for implementing, for instance, high order active filters.

In order to prevent distortion of the signals, however, it is necessary to associate fully differential switched operational amplifiers to circuits that perform an accurate control of the common-mode voltage. A control circuit of such a type is described in U.S. Pat. No. 5,973,537 issued on Oct. 26, 1999, according to which the outputs of a fully differential switched operational amplifier are connected, via respective switched capacitors, to the inverting input of a standard operational amplifier, in an integration configuration. Thereby, the output of the standard operational amplifier supplies a voltage that is proportional to the common-mode voltage and that can be used for modifying the biasing of the fully differential switched operational amplifier and for obtaining a preset common-mode voltage. In addition, the inverting input of the standard operational amplifier is alternately connected to ground and to the supply voltage via a further switched capacitor in order to prevent voltage jumps when the switched operational amplifier is turned on.

According to a different known solution, the outputs of the fully differential switched operational amplifier are connected to the supply line via a capacitive divider. An intermediate node of the capacitive divider, supplying a voltage correlated to the common-mode voltage and with a reduced dynamics with respect to the differential voltages of the switched operational amplifier, is connected to the inverting input of a standard operational amplifier, which also receives, on its non-inverting input, a reference voltage. The output voltage of the standard operational amplifier, correlated to the difference between the common-mode voltage and the reference voltage, is used for modifying the biasing of the switched operational amplifier and for obtaining a preset common-mode voltage, as in the previous case.

The above solutions, however, have a number of drawbacks. In both cases, in fact, an additional standard operational amplifier must be used, which increases circuit consumption and, furthermore, limits the performance of the circuit in terms of frequency response. The increase in power absorbed due to the standard operational amplifier is particularly disadvantageous when the circuit is used inside a very low consumption device. The second solution, moreover, requires the use of supply voltages higher than that of the switched operational amplifier.

SUMMARY OF THE INVENTION

The disclosed embodiments of the present invention provide a control circuit that overcomes the above described drawbacks and, in particular, results in a very low consumption, uses the same supply voltage as for the switched operational amplifier, and reduce the number of components.

In accordance with one embodiment of the present invention, a fully differential, switched capacitor, operational amplifier circuit with common-mode controlled output is provided, the operational amplifier circuit including a control circuit having a capacitive detecting network and a biasing control circuit. The capacitive detecting network includes a first capacitive element connected between a first differential output of the operational amplifier and a common-mode node, a second capacitive element coupled between the second differential output of the operational amplifier and the common-mode node, and a third capacitive element connected between the common-mode node and a biasing node that is connected to a first reference potential line in a first operative condition and a second reference potential line in a second operative condition. The biasing control circuit includes a control input connected to the common-mode node and an output connected to a control terminal of the operational amplifier. A switchable biasing circuit is further included that is activated for biasing the common-mode node at a desired voltage in a first operative condition and is deactivated in a second operative condition to leave the common-mode node in a floating condition.

BRIEF DESCRIPTION OF THE DRAWINGS

For a better understanding of the invention, an embodiment thereof is now described, purely to furnish a non-limiting example, with reference to the attached drawings, wherein.

DETAILED DESCRIPTION OF THE INVENTION

Figure 1:
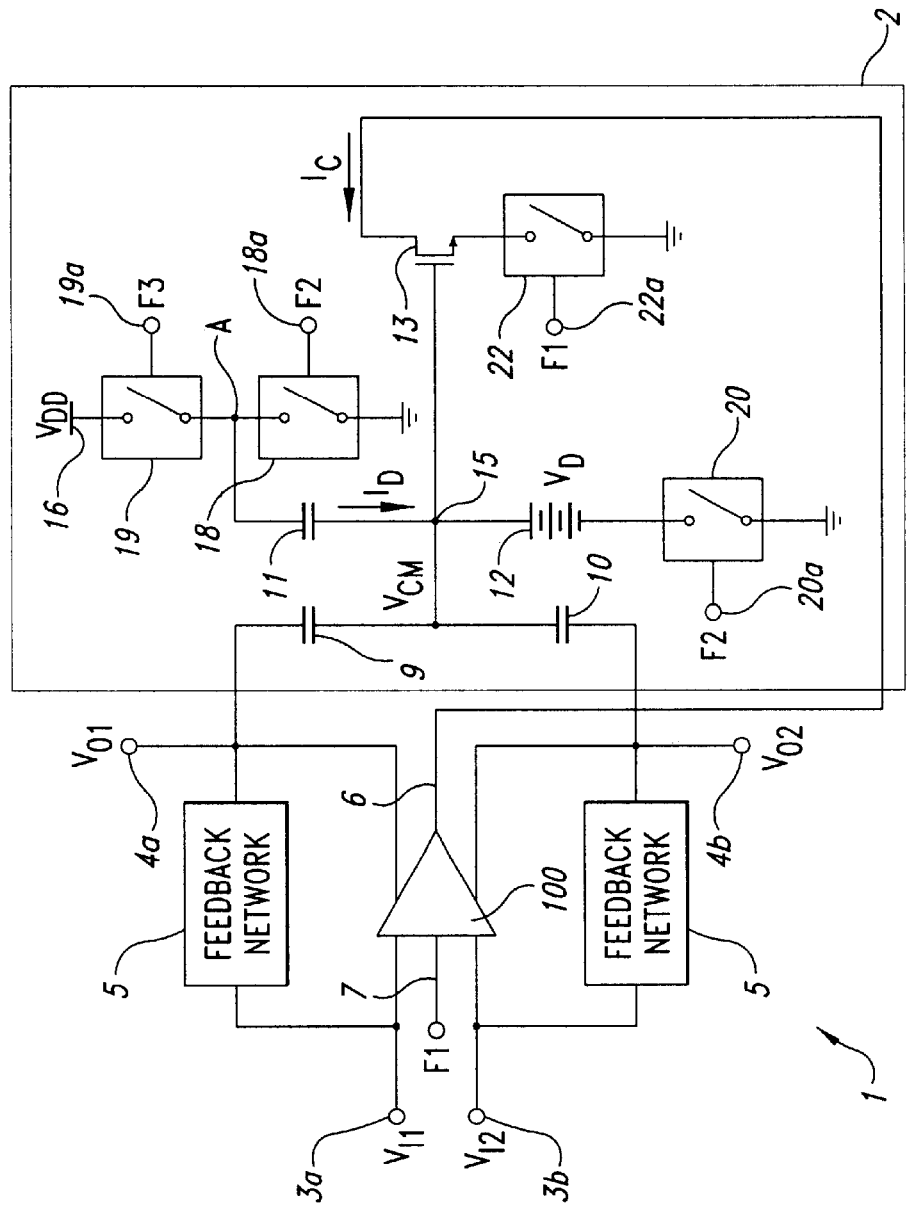
FIG. 1 shows a block diagram of a circuit according to the present invention.

FIG. 1 shows a switched capacitor circuit 1, of a fully differential type, with common-mode controlled output, comprising an operational amplifier 100, that is switched and has fully differential topology, and a common-mode control circuit 2.

The operational amplifier 100 has a first and a second inputs 3a, 3b forming inputs of the switched capacitor circuit 1 and receiving respective differential input voltages $V_{I1}$, $V_{I2}$, and first and second differential outputs 4a, 4b forming outputs of the switched capacitor circuit 1 and supplying, respectively, first and second differential output voltages $V_{O1}$, $V_{O2}$, which are symmetrical with respect to a common-mode voltage $V_{CM}$. Each of the differential outputs 4a, 4b is connected to a respective input 3a, 3b through a feedback network 5 of a capacitive and/or resistive type. Furthermore, the operational amplifier 100 has a control terminal 6 for regulating the biasing and an activation terminal 7 which receives a first phase signal F1 generated by a timing circuit (known and not illustrated). The first phase signal F1 causes the operational amplifier 100 to be alternately switched on and off.

The common-mode control circuit 2 comprises a first and a second read switched capacitors 9, 10, a compensation switched capacitor 11, a voltage source 12, and a control transistor 13.

The first and second read switched capacitors 9, 10, which have the same capacitances, are connected between a common-mode node 15 and the first differential output 4a, respectively the second differential output 4b of the operational amplifier 100.

The compensation switched capacitor 11 has a first terminal connected to the common-mode node 15 and a second terminal connected to a node A, which is connected alternately to ground through a first compensation switch 18 and to a supply line 16 through a second compensation switch 19. The supply line 16 supplies a supply voltage $V_{DD}$ (for example, 1.2 V). In particular, the first and second compensation switches 18, 19 are opened and closed in counterphase by a second and a third phase signals F2, F3 supplied to respective control terminals 18a, 19a.

The voltage source 12, which supplies a desired voltage $V_D$, preferably equal to $V_{DD}/2$, is connected to the common-mode node 15 and may be alternately switched on and off by an enabling switch 20 which receives the second phase signal F2 on an own control terminal 20a.

The control transistor 13 has its gate terminal connected to the common-mode node 15, its drain terminal connected to the control terminal 6 of the operational amplifier 100, and its source terminal connected to ground via a control switch 22 receiving the first phase signal F1 on an own control terminal 22a.

Operation of the switched capacitor circuit 1 is the following.

Figure 3:
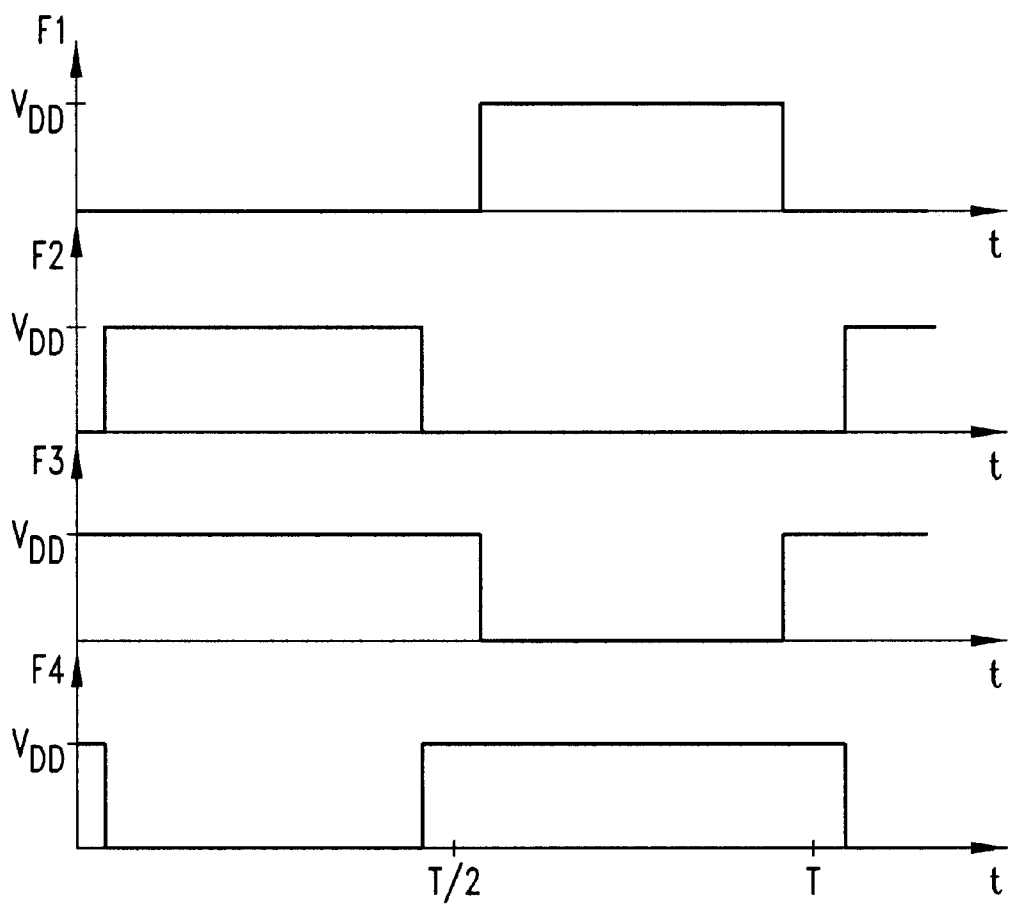
FIG. 3 shows plots of quantities of the circuit of FIG. 1.

The first, second and third phase signals F1, F2, F3 are periodic (see also FIG. 3). In particular, in a first half-period the first phase signal F1 switches the operational amplifier 100 off and controls opening of the control switch 22, turning the control transistor 13 off; the second phase signal F2 closes the first compensation switch 18 and the enabling switch 20; and the third phase signal F3 controls opening of the second compensation switch 19.

Consequently, the voltage source 12 is connected to the common-mode node 15, and the compensation switched capacitor 11 is connected between the common-mode node 15, which is at the desired voltage $V_D$, and ground. The compensation switched capacitor 11 is then charged to the voltage $V_D$. In addition, the differential outputs 4a, 4b of the operational amplifier 100, which is off, are brought to the supply voltage $V_{DD}$ in a known way, and consequently a voltage of $V_{DD}-V_D$ is present across the first and second read switched capacitors 9, 10.

In a second half-period, the first phase signal F1 closes the control switch 22 and activates the operational amplifier 100. Thereby, the control transistor 13, turning on, starts to conduct a control current $I_C$, and the first and second differential outputs 4a, 4b of the operational amplifier 100 respectively reach the first and the second differential voltages $V_{O1}$, $V_{O2}$, which, in absence of a signal, are equal to $V_{DD}/2$. At the same time, the second phase signal F2 controls opening of the first compensation switch 18 and of the enabling switch 20, and the third phase signal F3 closes the second compensation switch 19, so that the switched compensation capacitor 11 is connected between the common-mode node 15 and the supply line 16, and the voltage source 12 is not connected to the common-mode node 15.

In the second half-period, the capacitive circuit including the read switched capacitors 9, 10 and the compensation switched capacitor 11 has a dual biasing condition with respect to the first period, with node A set at the supply voltage $V_{DD}$ and, in absence of a signal on the outputs 3a, 3b, with the differential outputs 4a, 4b set at $V_{DD}/2$. Therefore, charge is distributed between the capacitors 9, 10 and 11, which, having equal capacitances, maintain the common-mode node 15 at the desired voltage $V_D$. It should be noted that, as regards the voltage stability of the common-mode node 15, the condition with no signals on the inputs 3a, 3b of the operational amplifier 100 is the most critical because both of the differential outputs 4a, 4b are lowered by $V_{DD}/2$.

On the other hand, if, for example, because of disturbance or temperature variations, the common-mode voltage $V_{CM}$ varies, the gate-to-source voltage $V_{GS}$ of the control transistor 13 is modified, and thus also the control current $I_C$ supplied to the control terminal of the operational amplifier 100 varies. The control current $I_C$ can be used, in a per se known manner, to modify biasing of the operational amplifier 100 and to bring the common-mode node voltage $V_{CM}$ back to the desired voltage $V_D$. For example, if the common-mode voltage $V_{CM}$ increases, the gate-to-source voltage $V_{GS}$ of the control transistor 13 increases, and thus also the control current $I_C$ increases.

Figure 2:
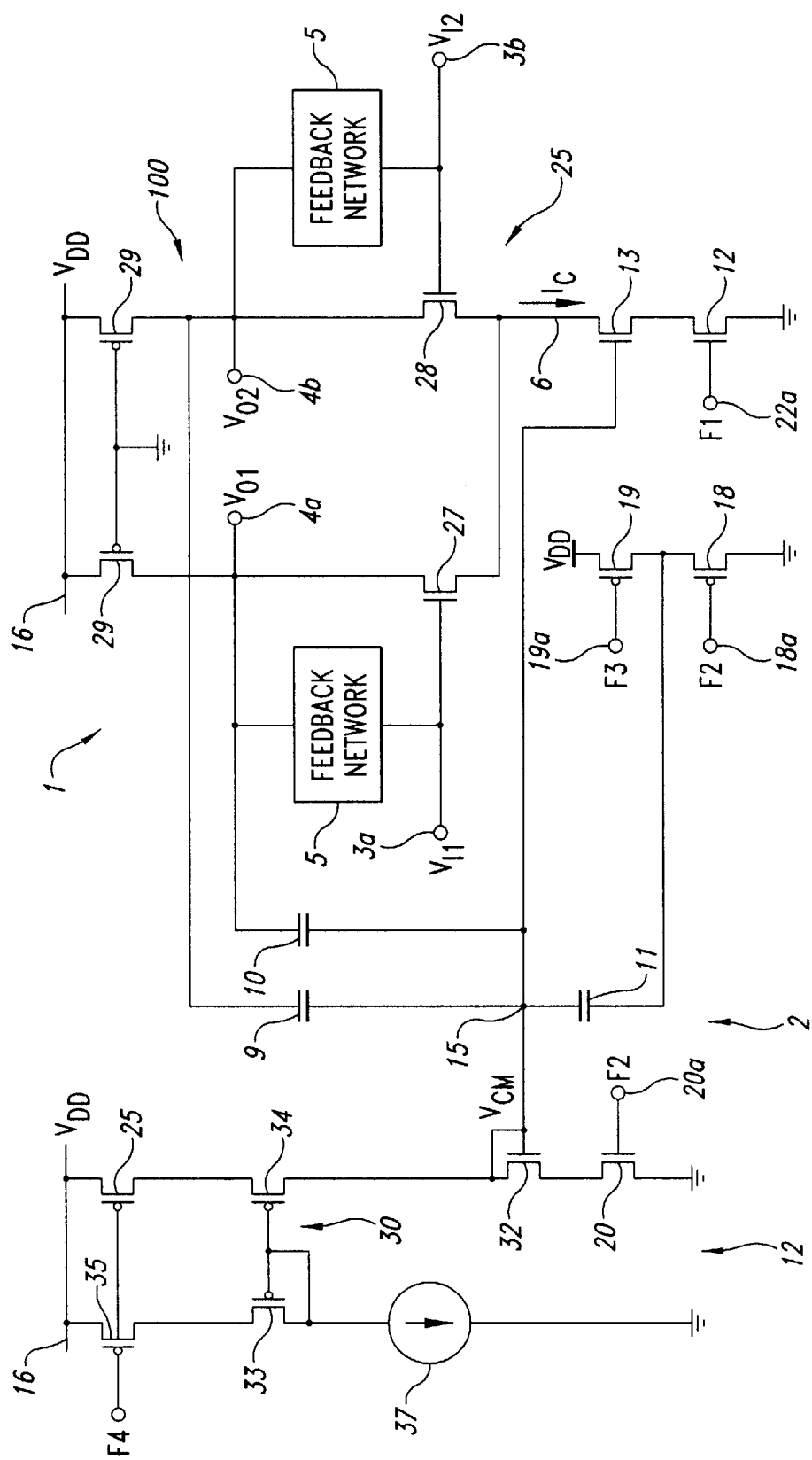
FIG. 2 illustrates a detailed circuit diagram of the circuit of FIG. 1.

A more detailed circuit diagram of the operational amplifier 100 and of the common-mode control circuit 2 is shown in FIG. 2, in which parts already illustrated in FIG. 1 are designated by the same reference numbers.

In particular, the operational amplifier 100 comprises a differential stage 25 including a first and a second input NMOS transistors 27, 28, that have respective source terminals connected to the drain terminal of the control transistor 13 and, in practice, defining the control terminal 6. The gate terminal and the drain terminal of the first input transistor 27 respectively define the first input 3a and the first differential output 4a of the operational amplifier 100; the gate terminal and the drain terminal of the second input transistor 28 respectively define the second input 3b and the second differential output 4b of the operational amplifier 100.

The differential stage 25 further comprises a pair of load transistors 29 which have source terminals connected to the supply line 16, gate terminals connected to ground, and drain terminals respectively connected to the first and to the second differential outputs 4a, 4b.

The voltage source 12 of the common-mode control circuit 2 is formed by a current mirror circuit 30 connected to a resistive transistor 32. The current mirror circuit 30 includes a first and a second mirror transistors 33, 34 having gate terminals connected to each other and source terminals connected to the supply line 16 via respective mirror switches 35 formed by PMOS transistors that receive, on respective gate terminals, a fourth phase signal F4, also generated in a known way. The first mirror transistor 33 is diode-connected. In addition, the source terminals of the first and second mirror transistors 33, 34 are respectively connected to a reference current source 37 and to the drain terminal of the resistive transistor 32.

The resistive transistor 32, which is of NMOS type and is diode-connected, has drain and gate terminals connected together and to the common-mode node 15 of the common-mode control circuit 2, and a source terminal connected to ground via the enabling switch 20. The enabling switch 20 is formed by an NMOS transistor that has source terminal connected to ground and gate terminal defining the control terminal 20a.

The first compensation switch 18 is formed by an NMOS transistor having source terminal connected to ground, drain terminal connected to the compensation capacitor 11, and gate terminal defining the control terminal 18a (which receives the second phase signal F2).

The second compensation switch 19 is formed by a PMOS transistor having source terminal connected to the supply line 16, drain terminal connected to the compensation capacitor 11, and gate terminal defining the control terminal 19a (which receives the third phase signal F3).

The control switch 22 is formed by an NMOS transistor having source terminal connected to ground, drain terminal connected to the source terminal of the control transistor 13, and gate terminal defining the control terminal 22a (which receives the first phase signal F1).

FIG. 3 shows the plots of the first, second, third and fourth phase signals F1, F2, F3, F4 in a period T. In particular, the first phase signal F1 and the second phase signal F2 close the respective switches, formed by NMOS transistors, when they have a value equal to the supply voltage $V_{DD}$ (namely, during the second half-period and the first half-period, respectively); the third phase signal F3 and the fourth phase signal F4 control closing of the respective switches, formed by PMOS transistors, when their amplitude is 0 V (namely, during the second half-period and the first half-period, respectively).

Consequently, during the first half-period the enabling switch 20, the mirror switches 35 and the first compensation switch 18 are closed, whereas all the other switches are open. The current mirror circuit 30 can thus conduct and inject current into the resistive transistor 32. Thereby, the current source 12 is enabled and forces the common-mode node 15 to the desired voltage $V_D$. Since, instead, the control switch 22 is open, no current flows in the differential stage 25, and the differential outputs 4a, 4b of the operational amplifier 100 reach the supply voltage $V_{DD}$. In addition, the compensation switched capacitor 11 is connected between the common-mode node 15 and ground, as mentioned previously.

During the second half-period, the control switch 22 and the second compensation switch 19 are closed, and all the other switches are open. The current mirror circuit 30 is thus off so as to disable the voltage source 12, while the control transistor 13 conducts the control current $I_C$, activating the differential stage 25. In addition, as mentioned previously, variations in the common-mode voltage $V_{CM}$ with respect to the desired voltage $V_D$ give rise to variations in the gate-to-source voltage $V_{GS}$ of the control transistor 13, and thus to variations in the control current $I_C$. Consequently, also the current flowing in the differential stage 25 varies, and the common-mode voltage $V_{CM}$ varies with opposite sign and returns to the desired voltage $V_D$. For example, an increase in the common-mode voltage $V_{CM}$ causes an increase in the gate-to-source voltage $V_{GS}$ of the control transistor 13, and thus of the control current $I_C$. Since also the current flowing in the differential stage 25 increases, the voltage drops on the load transistors 29 increase by equal amounts and reduce the first and second differential output voltages $V_{O1}$, $V_{O2}$. Also the common-mode voltage $V_{CM}$ thus decreases until it reaches the desired voltage $V_D$.

The circuit according to the invention has the following advantages.

First, control of the common-mode voltage $V_{CM}$ is performed with the exclusive use of passive components (switched capacitors), switches, and a control transistor, without using additional operational amplifiers. It is thus possible to obtain both a considerable reduction in absorbed power and an improvement in performance, which are factors of particular importance in case of use in very low power-consumption devices.

In addition, all the switches that are present are formed either by NMOS transistors having source terminals connected to ground or by PMOS transistors having source terminals connected to the supply line. The switches can therefore be driven by a minimal supply voltage, i.e., equal to the one necessary for the operational amplifier 100.

A reduced number of components is required for implementing the circuit according to the invention. In fact, the voltage source 12 and the control transistor 13 can be formed by components already present in the operational amplifier 100.

Finally, it is clear that modifications and variations may be made to the circuit described herein, without thereby departing from the scope of the present invention. In particular, the switched operational amplifier with fully differential topology may be of any type and have an architecture different from the one illustrated herein (for example, it could be a two-stage amplifier, in which case the common-mode control circuit 2 controls the first stage). Thus, the invention is to be limited only by the scope of the appended claims and the equivalents thereof.

What is claimed is:

1. A fully differential switched operational amplifier circuit with common-mode control, comprising:
    a first reference potential line and a second reference potential line respectively set at a first reference voltage and at a second reference voltage;
    a fully differential, switched operational amplifier alternately switchable on and off and having a first differential output and a second differential output, and a biasing control terminal;
    a control circuit comprising a capacitive detecting network and biasing control means, said capacitive detecting network including a first capacitive element, a second capacitive element and a third capacitive element, said first capacitive element connected between said first differential output of said operational amplifier, and a common-mode node, said second capacitive element coupled between said second differential output and said common-mode node, and said third capacitive element connected between said common-mode node and a biasing node that is connected to said first reference potential line in a first operative condition and said second reference potential line in a second operative condition, and said biasing control means having a control input connected to said common-mode node and an output connected to said control terminal of said operational amplifier, and switchable biasing means activated for biasing said common-mode node at a desired voltage in said first operative condition and deactivated in said second operative condition for leaving said common-mode node floating, said common-mode node directly connected to said biasing-control means.

2. The circuit of claim 1, wherein said switchable biasing means comprise a voltage source and enabling switches connected to said voltage source, and control switching means connected between said biasing control means and said control reference potential line for turning on said biasing control means in said second operative condition and turning off said control means in said first operative condition.

3. The circuit of claim 2, wherein said biasing control means comprise a control transistor having a control terminal connected to said common-mode node, a first conduction terminal connected to said control terminal of said operational amplifier, and a second conduction terminal connected to said second reference potential line via said control switching means.

4. The circuit of claim 3, wherein said control transistor comprises a MOS transistor.

5. The circuit of claim 2, wherein said control switching means and said enabling switching means each comprise an NMOS transistor having a source terminal connected to said second reference potential line.

6. The circuit of claim 2, wherein said voltage source comprises a current mirror circuit and a resistive transistor, said resistive transistor diode-connected and having a first conduction terminal connected to said common-mode node and a second conduction terminal connected to said second reference potential line via said enabling switching means.

7. The circuit of claim 6, wherein said voltage source comprises mirror switching means set between said current mirror circuit and said first reference potential line.

8. The circuit of claim 7, wherein said mirror switching means comprise at least one PMOS transistor having a source terminal connected to said first reference potential line.

9. The circuit of claim 1, wherein said capacitive detecting network comprises first compensation means and second compensation means controlled in counterphase and connected between said capacitive element, respectively said first reference potential line, and said second reference potential line.

10. A common-mode control method for a fully differential, switched capacitor, operational amplifier having a first differential output, a second differential output, and a biasing control terminal, comprising:

providing a first reference potential line and a second reference potential line respectively set at a first reference voltage and at a second reference voltage;

connecting a first capacitive element and a second capacitive element between said first differential output, respectively said second differential output, of said operational amplifier, and a common-mode node;

alternately connecting a third capacitive element between said common-mode node and said first reference potential line in a first operative condition, and between said common-mode node and said second reference potential line in a second operative condition;

connecting biasing control means between said common-mode node and said control terminal of said operational amplifier in said second operative condition;

biasing said common-mode node at a desired voltage in said first operative condition; and leaving said common-mode node floating in said second operative condition thereby said common-mode node reaches a common-mode voltage.

11. An operational amplifier having first and second differential outputs and coupled between a first reference potential line and a ground reference potential line, the circuit comprising:

a common-mode node capacitively coupled to the first differential output and capacitively coupled to the second differential output, and further capacitively coupled to a biasing node, the biasing node coupled to the first reference potential line via a first switch and to the ground reference potential via a second switch; and a switchable bias circuit coupled to the common-mode node and configured to bias the common-mode node at a bias voltage level in a first operative condition and to leave the common-mode node floating in a second operative condition.

12. The circuit of claim 11, wherein the switchable bias circuit comprises a voltage source configured to provide the bias voltage level voltage to the common-mode node in the first operative condition.

13. The circuit of claim 11, wherein the biasing node is coupled to the ground reference potential via the second switch and uncoupled from the first reference potential line via the first switch in the first operative condition.

14. The circuit of claim 11, wherein the biasing node is coupled to the first reference potential line via the first switch and uncoupled from the ground reference potential line via the second switch in the second operative condition.

15. The circuit of claim 11, comprising a control circuit configured to switch the operational amplifier off in the first operative condition and on in the second operative condition.

16. The circuit of claim 15, wherein the control circuit is coupled to the common-mode node and includes a first MOS transistor having a control terminal configured to receive a first periodic phase signal to switch the operational amplifier off in a first half-period and on in a second half-period.

17. The circuit of claim 15, wherein the control circuit is coupled to the common-mode node and includes a control switch having a first terminal configured to receive a first period phase signal, the second switch having a control terminal con figured to receive a second periodic phase signal, and the first switch having a control terminal configured to receive a third periodic phase signal, the control switch and first and second switches configured to operate in first and second half-periods, wherein during the first half-period the first switch is off, the second switch is on, and the control switch is off, and in the second half-period the first switch is on, the second switch is off, and the control switch is on.

18. The circuit of claim 16, further comprising a second MOS transistor coupled to the switchable bias circuit and having a control terminal configured to receive the second periodic phase signal whereby the common-mode node is coupled to the switchable bias circuit during the first half-period and uncoupled from the switchable bias circuit during the second half-period.

* * * * *

UNITED STATES PATENT AND TRADEMARK OFFICE
CERTIFICATE OF CORRECTION

PATENT NO.    : 6,411,166 B2
DATED         : June 25, 2002
INVENTOR(S)   : Andrea Baschirotto et al.

It is certified that error appears in the above-identified patent and that said Letters Patent is hereby corrected as shown below:

Title page,
Item [30], Foreign Application Priority Number should read as -- TO00A0493 --.

Signed and Sealed this

Seventeenth Day of December, 2002

JAMES E. ROGAN
*Director of the United States Patent and Trademark Office*